(12) United States Patent
Leung et al.

(10) Patent No.: US 11,714,470 B2
(45) Date of Patent: Aug. 1, 2023

(54) COMPUTING HEAT TRANSFER FOR USEFUL APPLICATIONS

(71) Applicant: Cryptoponics, Inc., Syracuse, NY (US)

(72) Inventors: Albert Leung, Rouses Point, NY (US); Greg Brienza, Rouses Point, NY (US)

(73) Assignee: CRYPTOPONICS, INC., Syracuse, NY (US)

( * ) Notice: Subject to any disclaimer, the term of this patent is extended or adjusted under 35 U.S.C. 154(b) by 481 days.

(21) Appl. No.: 16/891,733

(22) Filed: Jun. 3, 2020

(65) Prior Publication Data

US 2021/0018968 A1    Jan. 21, 2021

Related U.S. Application Data

(60) Provisional application No. 62/856,612, filed on Jun. 3, 2019.

(51) Int. Cl.
| | |
|---|---|
| *G06F 1/20* | (2006.01) |
| *H05K 7/20* | (2006.01) |
| *A01G 9/24* | (2006.01) |
| *F24F 11/80* | (2018.01) |
| *G05D 23/19* | (2006.01) |

(52) U.S. Cl.
CPC .............. *G06F 1/206* (2013.01); *A01G 9/245* (2013.01); *F24F 11/80* (2018.01); *H05K 7/20172* (2013.01); *H05K 7/20209* (2013.01); *G05D 23/1931* (2013.01)

(58) Field of Classification Search
CPC ...... G06F 1/206; G06F 2200/201; G06F 1/20; A01G 9/245; A01G 9/24; F24F 11/80; H05K 7/20172; H05K 7/20209; G05D 23/1931; Y02D 10/00; Y02P 60/14; Y02A 40/25
See application file for complete search history.

(56) References Cited

U.S. PATENT DOCUMENTS

| | | | |
|---|---|---|---|
| 2011/0132579 A1* | 6/2011 | Best ................ | H05K 7/20 165/104.31 |
| 2013/0178999 A1* | 7/2013 | Geissler ............. | G06F 9/5094 700/299 |
| 2014/0209272 A1* | 7/2014 | Stocker .............. | H05K 7/1497 165/59 |
| 2021/0318735 A1* | 10/2021 | Barbour ............. | G06F 16/2379 |

* cited by examiner

*Primary Examiner* — Charles R Kasenge
(74) *Attorney, Agent, or Firm* — Leason Ellis LLP

(57) ABSTRACT

A system for collecting waste heat from computing components and delivering the collected heat for useful applications is provided. At least a first heat exchanger is provided to collect the waste heat generated by the computing components. A further heat exchanger is provided to transfer the heat collected by the first heat exchanger and deliver it for useful applications. The useful applications can include providing heat to a building (e.g., residential, commercial, agricultural building). A controller is provided to operation of the components of the heat exchangers (e.g., fans, pumps, valves) to ensure that the computing components are maintained at a suitable temperature.

20 Claims, 3 Drawing Sheets

Abby

| Fan 1 | Fan 2 | Fan 2 |
|---|---|---|
| On: true | On: true | On: true |
| Register: 600 | Resister: 600 | Resister: 600 |
| Speed: 1.00 | Speed: 1.00 | Speed: 1.00 |

Indoor Temperature

80° F

KYZ Pulse

Roll Over: 569
Offset: 14358
KWH: 46,629.7
Time

Wednesday, May 1, 2019, 3:14:24 AM
Ping: 44s

COMPUTING HEAT TRANSFER FOR USEFUL APPLICATIONS

CROSS-REFERENCE TO RELATED APPLICATIONS

This application is based on and claims priority to U.S. Provisional Patent Ser. No. 62/856,612, filed Jun. 3, 2019, which is hereby incorporated by reference as if set forth in its entirety herein.

FIELD OF THE INVENTION

The present invention provides for a system for capturing heat from computing operations and, in particular, repurposing computing waste heat from, for example, crypto currency mining, for other useful applications.

BACKGROUND OF THE INVENTION

Large amounts of electrical energy are required for crypto-currency mining because most computers dedicated to a particular crypto-currency use proof-of-work (PoW) algorithms to add blocks to the block-chain. When blocks are added to the block-chain, the miner is rewarded in the form of crypto currency. PoW uses processing time on a computer as proof-of-work; usually in the form of solving some hash function and limiting the output of the hash function to a very low number. In any case, like all CPUs in computers, the busier the CPU is the more heat it generates. The more computers on the network, the more difficult it is to solve the PoW algorithm. The difficulty of the PoW rises as more computers join the network. Part of the reason for the increase in network activity is related to the profitability of the crypto currency. The higher the profitability, the more difficult it becomes to mine the crypto currency. As the difficulty rises, the more computing power is required, which results in the generation of even more heat.

However, it has been recognized herein that since the heat generated is a by-product of an otherwise profitable activity (crypto currency mining), the heat can be considered an essentially free resource that can be used for other useful applications, which is an issue addressed, among others, by the present invention.

SUMMARY OF THE INVENTION

According to a broad aspect of the invention, a computing waste heat energy collection system for collecting waste heat generated by the operation of computing components and providing the collected waste heat for useful applications is provided. In one or more embodiments, an air intake is provided upstream of the computing components. At least one fan is configured to move intake air across the computing component. The movement of the air across the computing components cools the computing components by heat transfer from the computing components to the air. At least one temperature sensor is configured to sense the temperature of the computing components.

A first heat exchanger is provided downstream of the computing components, the first heat exchanger is configured to collect heat transferred from the computing components to the air. A second heat exchanger is configured to transfer heat collected by the first heat exchanger and deliver the heat for useful applications. At least a first pump is provided for circulating a first working fluid through the first exchanger and at least a second pump for circulating a second working fluid through the second heat exchanger. A controller, which includes memory, software, and a processor executing the software, is provided. The controller is configured to receive temperature signals from the at least one temperature sensor, the controller being further configured to control operation of the at least one fan, the at least first pump, and the at least second pump.

According to a further aspect, the system further includes a vegetative mass. At least one sprayer fluidly connected to the first heat exchanger and disposed downstream of the second heat exchanger. The sprayer is configured to spray the first working fluid on the vegetative mass, wherein the first working fluid is water. At least one collection tank is configured to collect the first working fluid sprayed on the vegetative mass so that the collected first working fluid can be reintroduced into first heat exchanger.

According to a still further aspect, the vegetative mass is disposed upstream of the intake and, wherein the vegetative mass operates to cool the air prior to collection at the intake via evaporative cooling.

According to a further aspect, the useful application is providing heat to a building, and wherein the second pump circulates the second working fluid to transfer the heat collected from the computing components to provide heat to the building.

According to another further aspect, the useful application is providing potable heated water, and wherein second working fluid is potable water and the second pump circulates the second working fluid to transfer the heat collected from the computing components to provide the heated potable water.

According to a further aspect, at least one storage tank is operatively connected to the first and second heat exchangers, the storage tank being configured to provide a reservoir for the first working fluid so that the first working fluid can further cool prior to entering the first heat exchanger.

According to a further aspect, at least a second fan configured to circulate air across the second heat exchanger to increase the heat transfer rate between the first working fluid and the second working fluid is provided.

According to a further aspect, the computing components are configured for cryptocurrency mining operations.

According to a further aspect, the system is provided as a mobile unit so that the system can be transported to different locations.

According to a further aspect, a third heat exchanger is provided upstream of the computing components, the first heat exchanger being configured to cool the intake air.

According to a still further aspect, the third heat exchanger is fluidly connected to the first heat exchanger to receive the first working fluid after heat absorbed by the first working fluid is transferred to the second working fluid.

According to another aspect, a computing waste heat energy collection system is provided for collecting waste heat generated by the operation of computing components and providing the collected waste heat for air in a room in which the system is located. The system includes an air intake and at least one fan. The fan is configured to move the intake air across the computing components to cool the computing components by heat transfer from the computing components to the air. An exhaust is configured to expel the air heated by the heat transfer from the computing components to the room. The system includes at least a first temperature sensor that is configured to sense the temperature of the computing components and at least a second temperature sensor that is configured to sense the temperature of the room. A controller that includes memory, software, and a processor executing the software, is provided to receive temperature signals from the first and second temperature sensors. The controller is further configured to control operation of the at least one fan, wherein the controller is configured to increase the speed of the fan if the temperature of the room is below a setpoint, and wherein the controller is configured to decrease the speed of the fan if the temperature of the room is above the setpoint.

According to a further aspect, the controller can reduce the operation of the computing components if the temperature of the room is above the setpoint and the temperature of the computing components is above a threshold limit.

BRIEF DESCRIPTION OF THE DRAWINGS

FIG. 1 illustrates a data display in accordance with one embodiment of the present invention;

DETAILED DESCRIPTION CERTAIN OF EMBODIMENTS OF THE INVENTION

Figure 2:
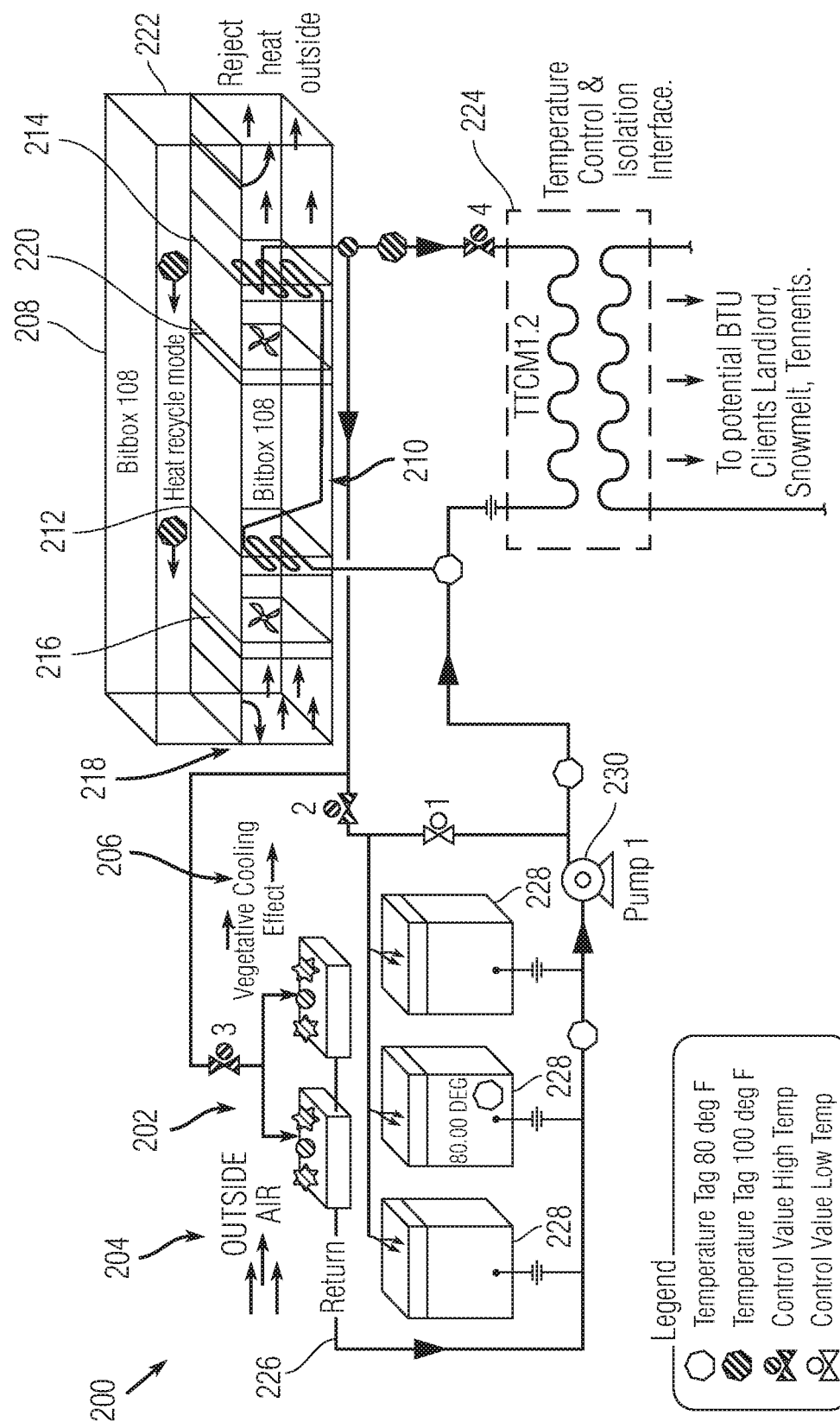
FIG. 2 shows an exemplary heat transfer system in accordance with one embodiment of the present invention.

A first issue that is addressed concerning crypto currency mining facilities, which can be generally referred to herein as "mining facilities" or mining activities, is the need to maintain the temperature of the mining facilities and the computer processors therein in order to ensure proper and efficient operation of processors and the mining facility in general.

One means of maintaining the proper temperature within the mining facility is to use fans that take air inside the facility and exhaust it to the outside. The rate at which the air is exhausted is controlled by the speed of the fans, which in turn varies the temperature of the facility. The higher the speed of the fans, the quicker the outside air replenishes the interior air, lowering the temperature of the space. The fans can be controlled using a computer system having a processer, memory, and software executing on the processor. A software module for controlling air temperature within the mining facility can include an air temperature control algorithm. The air temperature control algorithm can use variables such as interior temperature, the minimum allowed temperature, and the maximum allowed temperature as inputs, and the fan speed as an output. This defines a function with arguments as input, and an output, which is the feature to control. This function can be run in a suitable time slice by putting the control function inside of a run loop, with a timer delay that defines the control rate of the function. The more responsive the control, the shorter is the delay.

The control function can be generalized as: $f_i(a_1, a_2, a_3, \ldots a_n) \to C_i$ where fi is the control function with inputs, a, that vary the output of the thing controlled, Ci. Each control function, fi, is in its own separate run-loop for redundancy, and each run-loop has its own process, running on a Linux operating system, for example. The subscript in f denotes the process number of the control function. As one example, the control system can be implemented using a Raspberry Pi computer with a Raspbian operating system. To increase redundancy, use more computers to host the different run-loop scripts as processes on different computers.

To have an output, Ci, that is governed by a series of inputs to a hardware control system requires a communication layer. An exemplary communication layer, Modbus, can be used for both TCP/IP networks and serial communications. Modbus acts as a communication layer between the computer and the control unit, a programmable logic controller (PLC), and also between the PLC and the device that is controlled. The PLC device uses simple serial communications through a GS2 unit to talk to the controlled device, typically a motor. Sensors can be directly connected to the PLC device which acts as inputs. All inputs and outputs are stored in Modbus registers. When the register acts as an input, it is read by the control function, fi. When the register acts as an output, it is written to a register and it is read by the PLC. It is the responsibility of the control function to make sure the units of measurement are understood by the sensors and the device that needs to be controlled. The control function can be modeled in this way:

$$f_i(a_1, a_2, a_3, \ldots a_n) \to C_i(r_1, r_2, r_3, \ldots r_m)$$

where "i" is the process number of the control function, "a" are the inputs of the control function coming from Modbus registers, and "r" are the outputs that are written to Modbus registers. This architecture is limitless in the number of control features, is redundant to failure, and advantageously is inexpensive to implement.

Using the above described architecture provides a great degree of flexibility. This architecture can be used to remove heat from computing devices and reuse that heat for various different purposes, such as, for example, providing heat for other parts of a facility/building as a supplement to the building HVAC system, using the heat for snow melting, and/or using the heat for agricultural uses in greenhouses, hydroponic, or aquaponic systems. Depending on the intended use of the excess heat, there can be differences in the configuration of the physical system that can require a different number of fans, temperature sensors, valves, pumps, etc. The flexible architecture is designed so that the system can accommodate these various system inputs and outputs to be controlled and/or monitored. This system of Modbus registers, small computers, PLC unit, control units and sensors is referred to herein as the "ABBY system," or more generally the master control system. In short, the ABBY system executes software to inntegrate monitoring and control of crypto currency or digital server equipment with heating and/or aquaculture or agricultural systems. It serves as a controller and gateway for overall system control of energy consumption, resource management and data collection.

As one example, monitoring of the system can be achieved by publishing the data from the registers to a real time database. An exemplary system can include Google's Firebase, as one non-limiting implementation. Firebase includes SDK's that allows the publishing and control of data on different platforms, such as Web, Android and iOS operating systems. The control function can also create meta data from the registers so as to convert the raw data to the correct units, and log changes in the data based on time, before publishing the data to a real time database. Since these outputs from the control function are important to control the system, Firebase was selected as a real time database as one, non-limiting example, because it publishes the data instantly over the Internet using web sockets. Other systems can also be used that provide a similar function for control and monitoring of data.

FIG. 1 is an exemplary, non-limiting illustration of a display 100. The display 100 can be used for the display of meta data mapped to Modbus resisters shown on a web page using Firebase. The exemplary system includes three fans and one temperature sensor. FIG. 1 illustrates one example of how the data in the system can be displayed to a user using an appropriate graphical user interface.

Referring now to FIG. 2, an illustration of an exemplary system 200 for capturing heat from a computing system and repurposing that heat is provided. The system 200 includes a vegetation growing area 202. The vegetation growing area can include various grow boxes, hydroponic beds, or other similar means for growing and supporting vegetative matter. The vegetative matter can be, for example, edible plants or other valuable plants such that the plants are a valuable resource that can be utilized. The air cycle starts from outside air 204 that blows over the plants 202. The plants 202 cool the air further via an evaporative cooling effect. The vegetatively cooled air 206 can then be used to cool the primary computing systems, which can be processors, servers, etc. that require cooling (e.g., computer systems being used for crypto currency mining).

A housing 208 is provided so as to support and house fans, heat exchangers, and the computer components to be cooled. The housing 208 optimizes, concentrates and contains air to air and air to water heat transfer with server, digital computing or crypto currency equipment. The housing 208 (which can sometimes be referred to as a "BITBOX") concentrates the hot air generated by the mining computer components 210 with a first heat exchanger 212 located upstream of the computing components 210 and a second heat exchanger 214 located downstream of the computing components. An upstream fan 216 intakes outside air 218, which can be ambient environmental air and/or vegetatively cooled air 206. Heat exchanger 212 can further cool the intake air 218 before it blows across the computing components 210. A heat transfer occurs between the relatively cool intake air 218 and the relatively hot computing components 210 such that the intake air 218 is heated and the computing components 210 are cooled via the heat transfer. The heated air then passes through the downstream heat exchanger 214 to capture some of the heat in the heated air. The air can be moved across heat exchanger 214 via a second fan 220. As one example, water at 80° F. can enter the system, which is then heated through the heat transfer in the heat exchanger 214, to a higher temperature, such as 100° F. Any excess heat not captured by the heat exchanger 214 is exhausted via the movement of the exhaust air 222 to the outside environment.

The housing 208 concentrates the heat produced by the computers, which is desirable because it lowers the cost of cooling the computers dedicated to mining, and it centralizes the way the heat is distributed. Since the transport of heat may need to travel great distances to reach other parts of the facility, ducting the air to various parts of the facility using fans is not desirable or likely practical. Instead, the miner computers are concentrated into a small box, and the heated air is passed over the coils of the heat exchangers to trap the heat in water (or other working fluid), and pump the hot water to areas that require it. Water is a preferable working fluid since it can be used to irrigate vegetation and/or aquaponic fish tanks, as discussed in more detail below.

A portion of the heat captured from heat exchanger 214 can be passed through a working heat exchanger 224. The working heat exchanger 224 can be used to transfer the heat for useful applications, such as heating occupied building for comfort control, melting snow, etc. An exemplary heat exchanger can be the illustrated TTCM 1.2 unit, the temperature control and isolation surface. Heat is transferred from the TTCM unit to any location that requires it (building hvac, etc.). One example of deploying the heat to a location that requires it is discussed in more detail below in connection with a mobile version of the system. During winter the heat will be distributed to areas that need it, but during the summer the heat will be released to outside by controlling the valves direct the water to either TTCM unit or to the outside air.

The sensors that control the valves that direct the hot water to facility and the fish tanks, are controlled by the master control system (e.g., the ABBY system), using the control functions as described above. Opening valve 4 will direct the heated water from heat exchanger 214 through heat exchanger 224. Opening valve 3 can be used to direct water from the system to be used as irrigation for the vegetation. The water can be sprayed and through air currents and vegetative cooling effects, the water can be cooled. The irrigation water can be collected and reintroduced into the system via collection pipes 226. If necessary, the reclamation system can include filters to remove any particulates. Opening valve 2 can be used to direct water to collection tanks 228. Collection tanks 228 can be used as storage to allow the water to cool and/or house fish as part of an aquaponics system. Water then leaves the tanks and is pumped by a pump 230, which circulates the water throughout the system through various pipes. Opening valve 1 can be used to bypass tanks 228 an allow the water to return to the system.

Figure 3:
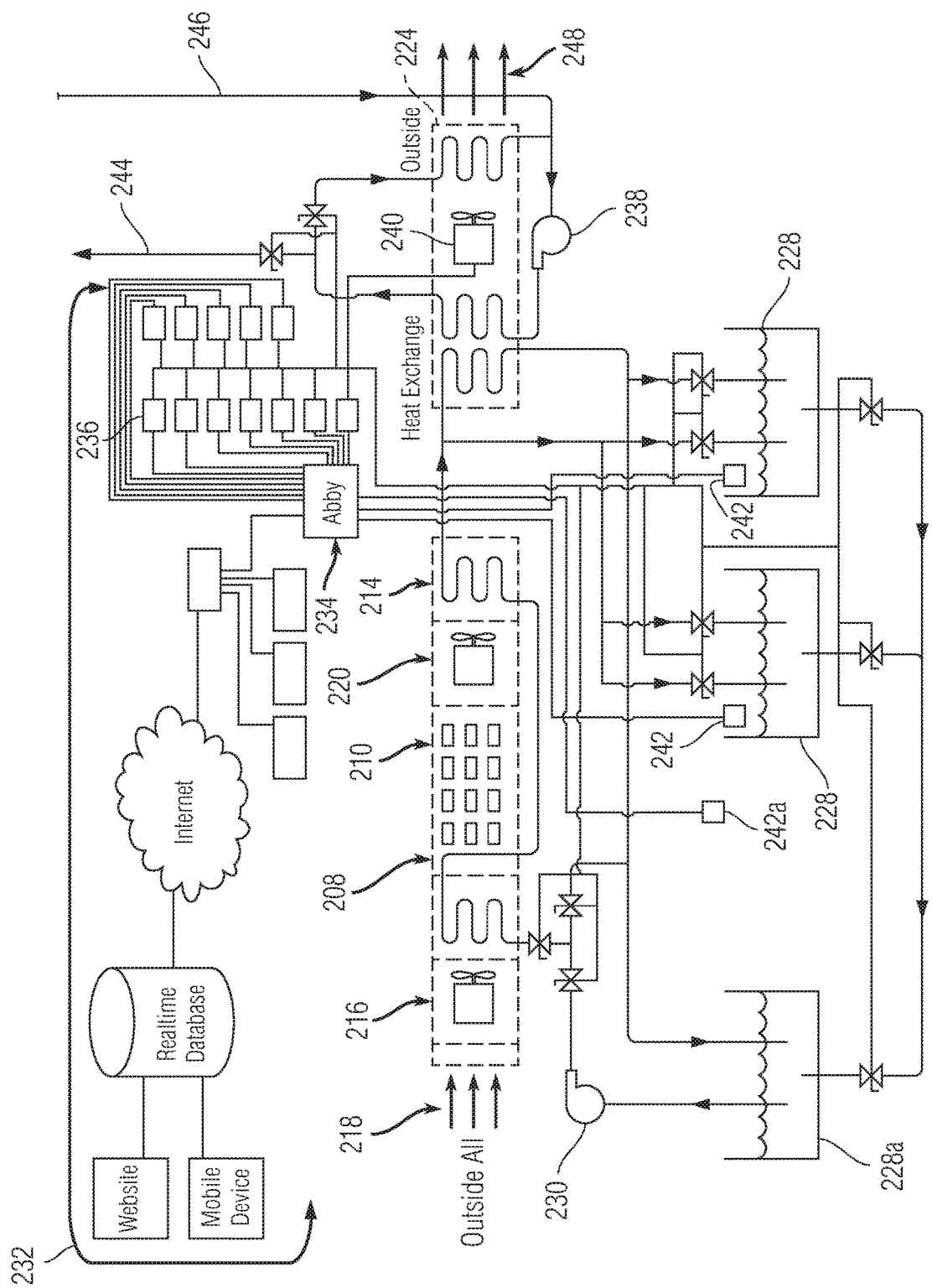
FIG. 3 shows a schematic illustration of the system of FIG. 2.

Referring to FIG. 3, the system 200 is illustrated in schematic form with further detail. The computer control and data display, as discussed in more detail above, is illustrated at 232. The ABBY control system 234 and input/output controllers 236 are used to received data (e.g., from various temperature sensors) and transmit control systems to operate various fans, pumps, and valves. In FIG. 3, the working heat exchanger 224 is illustrated with its own pump 238 and fan 240. In FIG. 3, in addition to the fluid pipes, wires are illustrated connecting the control valves and temperature sensors to the input/output controllers 236. Various temperature sensors 242 can be used to measure ambient air temperature and/or the temperature in tanks 228.

As one example, it is believed that the recovery from an installation would be about 46,851 Therms/yr. This is using about 156,600 W electricity from the miners. However, the system can be scaled and/or improved in order to achieve different recovery rates.

As an example, the system can be scaled to be incorporated into a mobile unit. For example, the system can be incorporated into a cargo area of a truck, such as a cargo container, box trailer, box bed, etc. As such, the system can be readily moved to areas that require the heat energy harvested by the system, which is particularly suitable for applications that require temporary heat sources. One potential exemplary application can be situations in which a building temporarily loses its primary heating system (e.g., boiler breakdown) and a temporary heat source is required. A truck that houses the system 200 (excluding the vegetative growing area) can be deployed proximate the building requiring the heat energy. A power source (e.g., gasoline generator, diesel generator, natural gas generator, solar panels, batteries, grid power, and/or other available power sources) provide power to the computer mining components 210 and other components that require electricity such as the control system 234 and various fans and/or pumps. Since the mobile system would be typically used in winter to provide heat to a building that requires heating, the air intake at 218 can be outside air, which provide an efficient source to cool the computing components 210, as shown in FIG. 3. Heat exchanger 224 can be used to capture the generated by the computing components and deliver it to the building requiring heat. This can be in the form of heated water that can be used for hot water systems (e.g., sinks, showers, etc) and/or hot water heating systems (e.g., radiators, in floor radiant heating, etc.). Heat exchanger 224 provides for heat transfer while also keeping the cooling fluid used to cool the computing components separate from the fluid supplied 244 to the building being heated. Accordingly, the fluid supplied to the building can be potable water in certain circumstances. In situations in which the heated water supplied to the building at 244 is consumed by the building (e.g., sinks, showers, etc.), the water returned at 246 to the heat exchanger can be obtained from the building water supply (or other suitable water source). In other applications, the building can include a HVAC system that includes a heat exchanger unit or a temporary heat exchanger unit can be provided to the building. As such, the fluid supply 244 and return 246 can be a closed loop system. In closed loop system, fluids other than water can be used and/or additives (e.g., antifreeze) can be added to the fluid. Further, exhaust air 248 can also be supplied to the building (e.g., through air ducting) to provide a further heat source to the building.

Accordingly, a system is provided for capturing heat from computing devices such as crypto currency mining computers. The heat captured can be used to, for example, provide environmental comfort to occupied building and be used as part of an aquaculture and/or hydroponic system for growing plants and/or fish. Recapturing this heat and using it in a useful way provides for greater efficiency of the operating mining computers by cooling them will provided further benefit (heating buildings and other structures, growing plants, growing fish) which can provide a savings and/or revenue source since building heat, plants, and fish can be valuable commodities.

A further advantage of the system is that the computing components can be more densely housed as compared to standard computing arrangements. The use of the fans and/or heat exchangers described above provide for an efficient cooling of the computing components, and the increased cooling capacity is a factor that allows the denser arrangement since the risk of overheating of the components is reduced. For example, it is believed that the density of the computing components can be increased by 10 times or a 1000% increase as compared to standard computing systems. It is believed that a density of 199.7 Watts per cubic foot of volume can be achieved as opposed to 20 Watts per cubic foot with a traditional system. It is believed that a density of the computing components is preferably greater than 50 Watts per cubic foot, and more preferably can be a range of from 100 to 300 Watts per cubic foot.

The increased density of the computing components has several advantages. A denser arrangement increases the efficiency of the capture of the waste heat, which increases the efficient of repurposing the waste heat for useful applications. Moreover, the increased density permits a reduction of the overall size of the system without reducing the computational power of the computing components. As such, arrangements are contemplated in which the system can be reduced to the size of a space heater or piece of furniture (e.g., coffee table), or to a size suitable for mounting on a wall (or for mounting in a window similar to a window air conditioner). With the system located directly within the building desired to be heated using the waste heat from the computing components, it is possible to simplify the heat capture and transfer system. For example, the system can include an air intake, a fan to blow the intake air across the computing components to transfer the heat from the computing components to the air, and an exhaust for expelling the heated air. The heated air can then be exhausted directly into the room to heat the space. The control system 234 can, using temperature sensors, monitor the temperature of the computing components and the temperature of room air. If the setpoint temperature of the room has not been reached, the control system 234 can increase the speed of the fan to transfer more of the waste heat to the room. If the upper limit setpoint of the room temperature has been reached, the control system can reduce the speed of the fan to reduce the heat transfer rate. In certain circumstances, if the upper room temperature has been reached and an upper limit temperature of the computing components has been reached, the control system can reduce the operation of the computing components (e.g., number and/or speed of operation) to prevent overheating of the computing components and the room temperature. Arrangements can also be provided in which the intake and/or exhaust is selectably connected to the outside of the building (e.g., via air ducts and/or controllable dampers). As such, if a room overheating situation should occur, the controller 234 can cause the damper to open so that at least a portion of the excess heat is exhausted to the outside. It is also contemplated that, should the system have trouble cooling the computing components due to the room intake air being too warm, the controller can cause a damper to open so that outdoor air is introduced into the intake if the outdoor air is cooler than the indoor air. As such, the costs of operating the computing components and the costs associated with cooling the dense computing components is offset by the saving of recapturing the waste heat to heat the building or other structure.

The subject matter described above is provided by way of illustration only and should not be construed as limiting. Various modifications and changes can be made to the subject matter described herein without following the example embodiments and applications illustrated and described, and without departing from the true spirit and scope of the present invention.

Notably, the figures and examples above are not meant to limit the scope of the present application to a single implementation, as other implementations are possible by way of interchange of some or all of the described or illustrated elements. Moreover, where certain elements of the present application can be partially or fully implemented using known components, only those portions of such known components that are necessary for an understanding of the present application are described, and detailed descriptions of other portions of such known components are omitted so as not to obscure the application. In the present specification, an implementation showing a singular component should not necessarily be limited to other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present application encompasses present and future known equivalents to the known components referred to herein by way of illustration.

The foregoing description of the specific implementations will so fully reveal the general nature of the application that others can, by applying knowledge within the skill of the relevant art(s) (including the contents of the documents cited and incorporated by reference herein), readily modify and/or adapt for various applications such specific implementations, without undue experimentation, without departing from the general concept of the present application. Such adaptations and modifications are therefore intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one skilled in the relevant art(s). It is to be understood that dimensions discussed or shown are drawings are shown accordingly to one example and other dimensions can be used without departing from the invention.

While various implementations of the present application have been described above, it should be understood that they have been presented by way of example, and not limitation. It would be apparent to one skilled in the relevant art(s) that various changes in form and detail could be made therein without departing from the spirit and scope of the application. Thus, the present application should not be limited by any of the above-described example implementations.

What is claimed is:

1. A computing waste heat energy collection system for collecting waste heat generated by the operation of computing components and providing the collected waste heat for useful applications, comprising:
    an air intake;
    at least one fan, the fan being configured to move the intake air across the computing components to cool the computing components by heat transfer from the computing components to the air;
    at least one temperature sensor, the temperature sensor being configured to sense the temperature of the computing components;
    a first heat exchanger provided downstream of the computing components, the first heat exchanger being configured to collect heat transferred from the computing components to the air;
    a second heat exchanger, the second heat exchanger being configured to transfer heat collected by the first heat exchanger and deliver the heat for useful applications;
    at least a first pump for circulating a first working fluid through the first heat exchanger;
    at least a second pump for circulating a second working fluid through the second heat exchanger; and
    a controller, the controller including memory, software, and a processor executing the software, the controller being configured to receive temperature signals from the at least one temperature sensor, the controller being further configured to control operation of the at least one fan, the at least first pump, and the at least second pump.

2. The system of claim 1, further comprising: a vegetative mass;
    a least one sprayer, the sprayer being fluidly connected to the first heat exchanger downstream of the second heat exchanger and being configured to spray the first working fluid on the vegetative mass, wherein the first working fluid is water; and
    a least one collection tank configured to collect the first working fluid sprayed on the vegetative mass so that the collected first working fluid can be reintroduced into first heat exchanger.

3. The system of claim 2, wherein the vegetative mass is disposed upstream of the intake and, wherein the vegetative mass operates to cool the air prior to collection at the intake via evaporative cooling.

4. The system of claim 1, wherein the useful application is providing heat to a building, and wherein the second pump circulates the second working fluid to transfer the heat collected from the computing components to provide heat to the building.

5. The system of claim 1, wherein the useful application is providing potable heated water, and wherein second working fluid is potable water and the second pump circulates the second working fluid to transfer the heat collected from the computing components to provide the heated potable water.

6. The system of claim 1, further including at least one storage tank operatively connected to the first heat exchanger, the storage tank being configured to provide a reservoir for the first working fluid so that the first working fluid can further cool prior to entering the first heat exchanger.

7. The system of claim 1, further including at least a second fan, the second fan being configured to circulate air across the second heat exchanger to increase the heat transfer rate between the first working fluid and the second working fluid.

8. The system of claim 1, wherein the computing components are configured for cryptocurrency mining operations.

9. The system of claim 1, wherein the system is provided as a mobile unit so that the system can be transported to different locations.

10. The system of claim 1, further including a third heat exchanger provided upstream of the computing components, the first heat exchanger being configured to cool the intake air.

11. The system of claim 10, wherein the third heat exchanger is fluidly connected to the first heat exchanger to receive the first working fluid after heat absorbed by the first working fluid is transferred to the second working fluid.

12. The system of claim 1, wherein the controller can reduce the operation of the computing components if there is an excess of delivered heat and the temperature of the computing components is above a threshold limit.

13. The system of claim 1, further comprising a housing for the computing components, where the computing components disposed in the housing have a density greater than 50 Watts per cubic foot.

14. A computing waste heat energy collection system for collecting waste heat generated by the operation of computing components and providing the collected waste heat for air in a room in which the system is located, comprising:
    an air intake;
    at least one fan, the fan being configured to move the intake air across the computing components to cool the computing components by heat transfer from the computing components to the air;
    a heat exchanger positioned in the room, distinct from the at least one fan, that is positioned to further cool the intake air before the intake air reaches the computing components;
    an exhaust configured to expel the air heated by the heat transfer from the computing components to the room;
    at least a first temperature sensor, the first temperature sensor being configured to sense the temperature of the computing components;
    at least a second temperature sensor, the second temperature sensor being configured to sense the temperature of the room; and
    a controller, the controller including memory, software, and a processor executing the software, the controller being configured to receive temperature signals from the first and second temperature sensors, the controller being further configured to control operation of the at least one fan, wherein the controller is configured to increase the speed of the fan if the temperature of the room is below a setpoint, and wherein the controller is configured to decrease the speed of the fan if the temperature of the room is above the setpoint.

15. The system of claim 14, wherein the controller can reduce the operation of the computing components if the temperature of the room is above the setpoint and the temperature of the computing components is above a threshold limit.

16. The system of claim 14, further comprising a housing for the computing components, where the computing components disposed in the housing have a density greater than 50 Watts per cubic foot.

17. The system of claim 14, further comprising a housing for the computing components, where the computing components disposed in the housing have a density in a range of from 100 to 300 Watts per cubic foot.

18. A computing waste heat energy collection system for collecting waste heat generated by the operation of computing components at a location and providing the collected waste heat for delivery external to the location, comprising:
an air intake;
at least one fan, the fan being configured to move the intake air across the computing components to cool the computing components by heat transfer from the computing components to the air;
a heat exchanger positioned downstream from the computing components and in a stream of the air so as to capture at least a portion of the heat transferred to the air from the computing components for delivery external to the location of the computing components;
at least a first temperature sensor, the first temperature sensor being configured to sense the temperature of the computing components;
at least a second temperature sensor, the second temperature sensor being configured to sense the temperature of the room; and
a controller, the controller including memory, software, and a processor executing the software, the controller being configured to receive temperature signals from the first and second temperature sensors, the controller being further configured to control operation of the at least one fan,
wherein the controller is configured to increase the speed of the fan if the temperature of the room is below a setpoint, and wherein the controller is configured to decrease the speed of the fan if the temperature of the room is above the setpoint.

19. The computing waste heat energy collection system of claim 18, wherein the heat exchanger uses water as a medium to capture heat transferred to the air from the computing components.

20. The computing waste heat energy collection system of claim 18, further comprising an exhaust positioned downstream from the heat exchanger that is arranged to exhaust excess heat not captured by the heat exchanger via movement of exhaust air to an outside environment.

* * * * *

UNITED STATES PATENT AND TRADEMARK OFFICE
CERTIFICATE OF CORRECTION

PATENT NO. : 11,714,470 B2
APPLICATION NO. : 16/891733
DATED : August 1, 2023
INVENTOR(S) : Albert Leung and Greg Brienza It is certified that error appears in the above-identified patent and that said Letters Patent is hereby corrected as shown below:

In the Claims

Column 9, Line 53-63 Claim 2 which formerly read:
2. The system of claim 1, further comprising:
 a vegetative mass;
 a least one sprayer, the sprayer being fluidly connected to
the first heat exchanger downstream of the second heat
exchanger and being configured to spray the first working fluid
on the vegetative mass, wherein the first working fluid is water; and
 a least one collection tank configured to collect the first
working fluid sprayed on the vegetative mass so that the collected
first working fluid can be reintroduced into first heat exchanger.

Should read:
--2. The system of claim 1, further comprising:
 a vegetative mass;
 at least one sprayer, the sprayer being fluidly connected to
the first heat exchanger downstream of the second heat
exchanger and being configured to spray the first working fluid
on the vegetative mass, wherein the first working fluid is water; and
 at least one collection tank configured to collect the first
working fluid sprayed on the vegetative mass so that the collected
first working fluid can be reintroduced into first heat exchanger.--

Signed and Sealed this
Seventh Day of November, 2023

Katherine Kelly Vidal
*Director of the United States Patent and Trademark Office*